US007961894B2

(12) United States Patent
Honji

(10) Patent No.: US 7,961,894 B2
(45) Date of Patent: Jun. 14, 2011

(54) ENGINE SOUND PROCESSING SYSTEM

(75) Inventor: Yoshikazu Honji, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1189 days.

(21) Appl. No.: 11/076,660

(22) Filed: Mar. 10, 2005

(65) Prior Publication Data

US 2005/0201570 A1 Sep. 15, 2005

(30) Foreign Application Priority Data

Mar. 10, 2004 (JP) ................................ 2004-067799
Jan. 20, 2005 (JP) ................................ 2005-013330

(51) Int. Cl.
*H03G 3/00* (2006.01)

(52) U.S. Cl. ............ 381/61; 381/86; 381/79; 340/384.3

(58) Field of Classification Search .................... 381/86, 381/71.4, 300, 302, 77, 61, 119, 111, 122, 381/79; 340/441, 384.1, 384.3; 446/7; 703/8
See application file for complete search history.

(56) References Cited

U.S. PATENT DOCUMENTS

| | | | | |
|---|---|---|---|---|
| 5,237,617 | A * | 8/1993 | Miller | 381/61 |
| 5,371,802 | A * | 12/1994 | McDonald et al. | 381/71.4 |
| 5,635,903 | A * | 6/1997 | Koike et al. | 340/441 |
| 5,748,748 | A * | 5/1998 | Fischer et al. | 381/71.4 |
| 5,820,442 | A * | 10/1998 | Helder | 446/404 |
| 5,835,605 | A * | 11/1998 | Kunimoto | 381/61 |
| 5,917,920 | A * | 6/1999 | Humphries | 381/86 |
| 6,275,590 | B1 * | 8/2001 | Prus | 381/61 |
| 6,317,503 | B1 * | 11/2001 | Mercs et al. | 381/119 |
| 6,356,185 | B1 * | 3/2002 | Plugge et al. | 340/384.3 |
| 6,592,375 | B2 * | 7/2003 | Henry et al. | 434/62 |
| 6,859,539 | B1 * | 2/2005 | Maeda | 381/86 |
| 6,959,094 | B1 * | 10/2005 | Cascone et al. | 381/86 |
| 7,096,169 | B2 * | 8/2006 | Crutchfield, Jr. | 703/7 |
| 7,203,321 | B1 * | 4/2007 | Freymann et al. | 381/61 |
| 2008/0192954 | A1 * | 8/2008 | Honji et al. | 381/86 |

FOREIGN PATENT DOCUMENTS

| | | |
|---|---|---|
| JP | 2041953 | 2/1990 |
| JP | H04-54742 U | 5/1992 |
| JP | 5-80790 | 4/1993 |
| JP | 7149186 | 6/1995 |
| JP | 7-302093 | 11/1995 |
| JP | 2000-172281 | 6/2000 |
| JP | 2001-294089 | 10/2001 |

OTHER PUBLICATIONS

Notification of Reasons for Rejection for Japanese patent application No. 2004-013330, dated Mar. 25, 2008 (6 pgs.).

* cited by examiner

*Primary Examiner* — Vivian Chin
*Assistant Examiner* — Jason R Kurr
(74) *Attorney, Agent, or Firm* — Pillsbury Winthrop Shaw Pittman LLP

(57) ABSTRACT

Microphone are provided to an intake port of an engine and a wall surface of an engine room on the interior side respectively to collect an engine sound. The engine sound is processed by a signal processing portion and output via a speaker provided to an interior of a vehicle. Filters for simulating the noise insulating characteristic in the interior of the vehicle and filters for processing the engine sound to emphasize the driving conditions are provided to the signal processing portion. Filter characteristics of the filters are decided in response to sensed values of an engine revolution sensor 30, an accelerator opening angle sensor, and a speed sensor. The driving conditions are emphasized by filtering the engine sound based on the filter characteristics.

8 Claims, 5 Drawing Sheets

ENGINE SPEED
↓
INTAKE NOISE/
ENGINE EXPLOSION SOUND

ACCEL OPENING
ANGLE
↓
INTAKE NOISE

SPEED
↓
ENTIRE
VOLUME

ACCELERATOR
OPENING ANGLE/
ENGINE SPEED
↓
MIXING WEIGHT OF
INTAKE NOISE/
ENGINE EXPLOSION SOUND

ENGINE SOUND PROCESSING SYSTEM

BACKGROUND OF THE INVENTION

The present invention relates to an engine sound processing system that processes an engine sound of a vehicle (automobile) to reproduce the processed engine sound in an interior of the vehicle.

In the related art, the quiet is required of the interior of the vehicle. In particular, as with the engine sound, such a design is adopted that the engine sound does not escape into the interior of the vehicle to the utmost, by interposing the thick noise insulation material between the engine room and the interior of the vehicle, or the like.

However, it is impossible to say that the interior space of the vehicle in the above high quiet is always the most comfortable driving circumstances for the passenger of the vehicle. In other words, in some cases the driver as the driving fan, or the like feels more comfortable in the situation that such driver can hear the moderate engine sound in the interior of the vehicle as the driving circumstances.

In order to realize the taste of such driving fan, the systems for producing artificially the engine sound in the quiet interior of the vehicle were proposed.

As such system, for example, there were the system for capable of sounding the engine sound while emphasizing a part of the frequency band by generating the sinusoidal or pulse sound, which agrees with the number of revolution of the engine (which synchronizes with the engine sound), to emit into the interior of the vehicle and then adding such sinusoidal or pulse sound to the engine sound that actually escapes into the interior of the vehicle (e.g., see Patent Literature 1, Patent Literature 2), the system for sounding a desired engine sound in the interior of the vehicle by recording a desired engine sound previously and then reproducing this recorded engine sound in response to the number of revolution of the engine (e.g., see Patent Literature 3), and others.

Patent Literature 1: JP-A-5-80790
Patent Literature 2: JP-A-2000-172281
Patent Literature 3: JP-A-7-302093

However, the systems set forth in Patent Literatures 1, 2, 3 also generates another sound that is different from the actual engine sound of the vehicle. Therefore, even if the driving conditions are sensed by using other types of sensors, the sound on which the actual engine sound is reflected exactly in response to the driving conditions cannot be always produced.

SUMMARY OF THE INVENTION

It is an object of the present invention to provide an engine sound processing system capable of generating an engine sound, which is processed with sterling reality, in an interior of a vehicle by collecting the actual engine sound and processing/outputting the engine sound.

In order to solve the aforesaid object, the invention is characterized by having the following arrangement.

(1) An engine sound processing system comprising:

a plurality of microphones that are provided outside an interior of a vehicle and collect an engine sound of a vehicle;

a sensor that senses driving condition of the vehicle;

a signal processing portion that processes the engine sound collected by the plurality of microphones and outputs processed signal; and a control portion that controls the signal processing portion based on contents sensed by the plurality of sensors.

(2) The engine sound processing system according to (1), wherein the signal processing portion includes a sound insulating characteristic filter which simulates a sound insulating characteristic of a wall of the interior and an active filter characteristic of which is varied according to the driving condition.

(3) The engine sound processing system according to (1) further comprising a mixer that mixes engine sounds collected respectively by the plurality of microphones, and outputs it to the signal processing portion.

(4) The engine sound processing system according to (1), wherein the signal processing portion separately processes the engine sounds collected by the plurality of microphones.

(5) The engine sound processing system according to (1), wherein the plurality of sensors include at least one of a sensor for sensing an engine revolution, a sensor for sensing an accelerator opening angle, and a sensor for sensing a speed of the vehicle.

(6) The engine sound processing system according to (1), wherein the plurality of microphones are provided at at least one of an intake port, an exhaust port and a wall of an engine room.

(7) The engine sound processing system according to (1), wherein the microphones comprises a sound microphone or a vibration sensor.

In the present invention, the audio circuit for outputting the engine sound processed by the signal processing portion into the interior of the vehicle via the speaker may be provided in the engine sound processing system, otherwise the processed engine sound may be output via the existing vehicle audio device such as the vehicle stereo, or the like connected to the engine sound processing system.

In the present invention, the actual engine sound on which the driving conditions at that time are reflected exactly is collected, and then such engine sound is processed to emphasize further the driving conditions at that time. As a result, the actual engine sound that is emphasized further in response to the driving conditions at that time can be output into the interior of the vehicle, and also the interior space of the vehicle in which the driving fan feels comfortable can be produced.

As described above, according to the present invention, the actual engine sound is collected by a microphone installed outside the interior of the vehicle, and the engine sound capable of emphasizing the driving conditions by processing the actual engine sound can be output into the interior of the vehicle. Therefore, the realistic engine sound effect can be produced by the easy process, and also the interior space of the vehicle in which the driving fan feels comfortable can be produced.

Further, the engine sounds corrected by each microphone can be processed individually, effect of the engine sound can be changed to create comfortable vehicle interior space in response to preference of the driving fun.

DETAILED DESCRIPTION OF PREFERRED EMBODIMENTS

Figure 1:
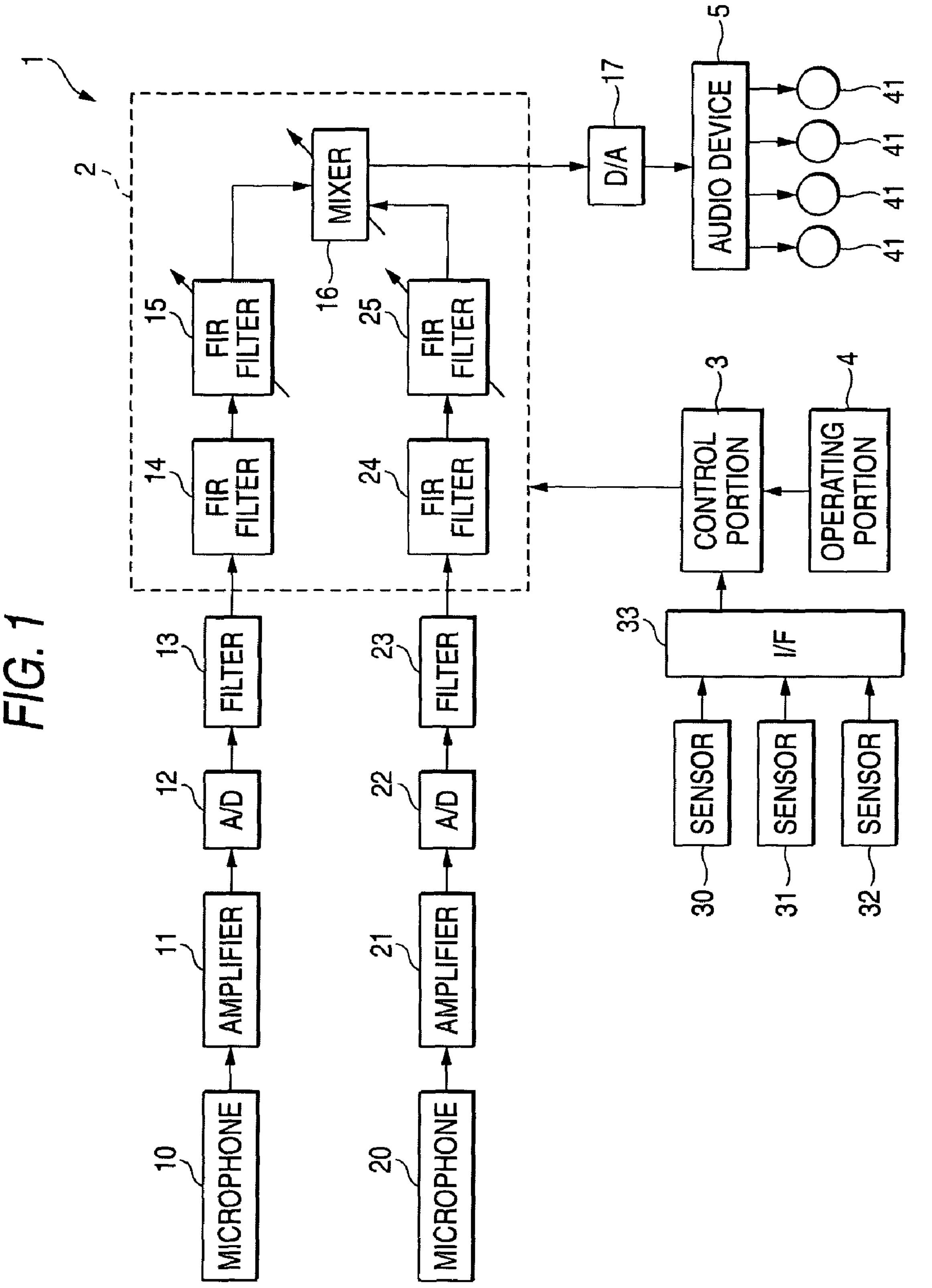
FIG. 1 is a block diagram of an engine sound processing system as an embodiment of the present invention.
Figure 2:
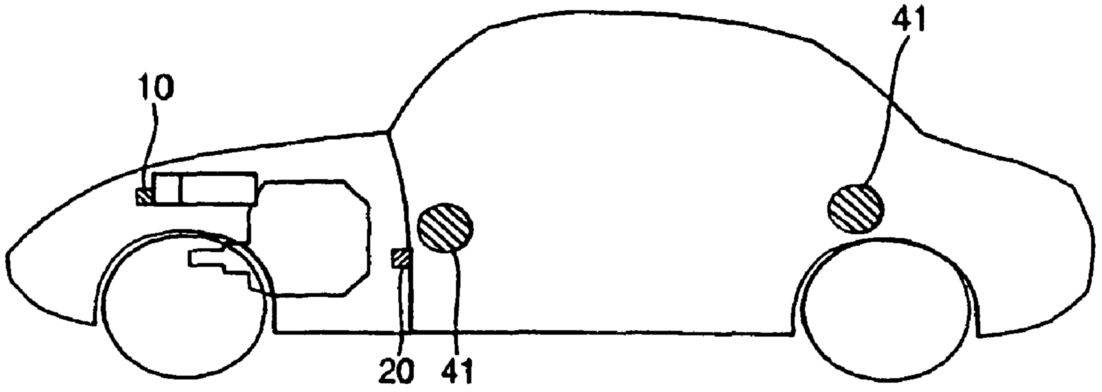
FIG. 2 is a view explaining fitted positions of microphones and speakers in the engine sound processing system.

An engine sound processing system as an embodiment of the present invention will be described with reference to the drawings hereinafter. FIG. 1 is a block diagram of the same engine sound processing system. FIG. 2 is a view explaining mounted positions of microphones and speakers in the engine sound processing system.

As shown in FIG. 2, an engine sound processing system 1 includes two microphones 10, 20, which are provided to an intake port of an engine and a wall surface of an engine room on the vehicle interior side respectively. This is because mainly an intake noise and an operating (explosion) noise of the engine are heard in the interior of the vehicle as the engine sound and because an exhaust noise does not so contribute to the engine sound in the interior of the vehicle. However, the number and installed positions of the microphones are not limited to this embodiment. For example, the microphone may be arranged at the vicinity of a muffler to collect the exhaust gas, or may be arranged at the vicinity of an engine head to collect mechanical sound of a chain, for example.

Incidentally, since the microphones arranged at the respective positions can collect the different sounds depending on each arranged position, the system may be structured so that plural microphones are arranged at the respective arranged position and the collected sounds are mixed. For example, the microphone arranged at a wall surface of an engine room at the interior side can collect an operating sounds of difference portions of the engine depending on the arranged position. Therefore, the microphones may arranged at the wall surface of the engine room at the interior side and the sounds collected by the respective microphone are mixed. A mixing ratio is adjusted on the basis of the necessary sound quality and the engine operating noise is collected.

The microphone is not limited to a sound microphone. For example, a vibration sensor capable of picking up a vibration of audio frequency band can be employed, for example. by arranging the vibration sensor on the engine, the vibration of the audio frequency band of the engine can be directly collected, that is, the vibration of the engine before it is transformed into sound can be collected. Namely, the vibration sensor does not detect a vibration pulse of the engine but picks up a signal as a sound source of the engine. By arranging the vibration sensor at the intake port, the sound such as wind noise which is not related to the engine revolutions is not collected and only the intake sound can be collected. On the other hand, a sound microphone is arranged at the vicinity of the mounting portion of the muffler and an exhaust sound having a frequency peak corresponding to the engine revolution degree. Accordingly, the sound microphone and the vibration microphone can be arranged according to the arranged position.

Four speakers 41, i.e., front left and right speakers and rear left and right speakers, are provided in the interior of the vehicle. These speakers 41 are used commonly in the audio device, and are not originally designed for the engine sound processing system. In other words, in this engine sound processing system, the engine sound is collected and processed, then the audio signal is input into a vehicle audio device 5, and then the engine sound is output into the interior of the vehicle via the vehicle audio device 5.

In FIG. 1, the microphone 10 and the microphone 20 are connected to an amplifier 11 and an amplifier 21 respectively. The amplifier 11 and the amplifier 21 amplify the sound signals (intake noise, engine sound) input from the microphone 10 and the microphone 20, respectively. The amplified sound signals are converted into digital signals by A/D converters 12, 22, respectively. Unnecessary frequency bands which substantially does not include the intake sound and the engine explosion sound are cut away from the digital sound signals by filters 13, 23. When a signal level is too large, the sound signals are attenuated by these filters. Therefore, the filters 13, 23 may be constituted by a combination of a low-pass filter, a high-pass filter, an attenuator, etc. respectively.

The signals, a frequency band and a signal level of which are limited by the filter 13 and the filter 23 respectively, are input into a signal processing portion 2. The signal processing portion 2 applies two-step filtering process to both the intake noise collected via the microphone 10 and the engine sound on the wall surface of the engine room collected via the microphone 20 in separate systems respectively. In this case, this filtering process may be executed in one system after both signals are mixed.

In the signal processing portion 2, a filter 14 and a filter 24 are filters that simulate the noise insulating characteristic of the wall surface of the interior of the vehicle. In other words, since the microphone 10 and the microphone 20 collect directly the sound in the engine room, the sound signal contains the mechanical noise in a high frequency range at a high level and thus is widely different from the engine sound that is heard in the interior of the vehicle by the passenger such as the driver, or the like. Therefore, in order to put this sound signal close to the quality of sound (frequency distribution) similar to the engine sound that is heard in the interior of the vehicle, the sound signal is processed into the sound, in which the high tone range is cut and the low tone range is left, by simulating the noise insulating characteristic of the wall surface of the interior of the vehicle by the filters 14, 24. This noise insulating characteristic may not be always detected by simulating the noise insulating characteristic of the vehicle into which this system is installed, and may be detected by simulating the noise insulating characteristic of the sports car or the high-class automobile.

In this case, the filter characteristic (noise insulating characteristic) of the filter 14 and the filter 24 maybe fixed, but their settings may be varied to change the sounding way of the engine sound.

Filter 15 and filter 25 of subsequent-stage are active filters the characteristics of which are changed in response to the driving conditions, and process the engine sound (the intake noise and the engine explosion sound collected by the microphone 10 and the microphone 20) in response to the driving conditions. Therefore, the filters 15, 25 are constituted by the active filter whose characteristic is changed in real time in response to the driving conditions. The change in the filter characteristic will be described later.

The intake noise and the engine explosion sound output from two-stage filter 14-filter 15 and a filter 24—a filter 25 are mixed into a sound signal in one system by a mixer 16, then is converted into analog audio signal by the D/A converter 17, and then is output to the audio device 5. The sound signal of this 1 system includes stereo outputs (L/R).

As the sensor for sensing the driving conditions, an engine revolution sensor 30 for sensing an engine revolution, an accelerator opening angle sensor 31 for sensing an opening angle of an accelerator, and a speed sensor 32 for sensing a speed of the vehicle are provided. Sensed values of respective sensors are input into a control portion 3 via an interface 33.

An A/D converter is built in the interface 33 as the case may be. When the engine revolution sensor 30 and the speed sensor 32 are constituted by an encoder that outputs pulses in response to the revolution of the engine or the revolution of the axle, the control portion 3 may calculate the number of revolution of the engine and the speed based on an integrated value of the pulses or a pulse interval.

The control portion 3 determines parameters that define filter characteristics of the filter 15 and the filter 25 and a mixing ratio thereof according to the output of the sensors. The control portion 3 outputs the determined parameters and mixing ratio to the signal processing portion 2 to control the filter 15, the filter 25 and the mixer 16.

An operating portion 4 is connected to the control portion 3. This operating portion 4 maybe shared with the vehicle audio device 5, or the signal may be input from the operation portion of the audio device. The user (driver) sets control characteristics of the filters 15, 25 and the mixer 16 by operating the operating portion 4 in response to the driving conditions (outputs from the sensors 30, 31, 32). The user (driver) sets the filter characteristic (noise insulating characteristic) of the filters 14, 24 by operating the operating portion 4.

Figure 3:
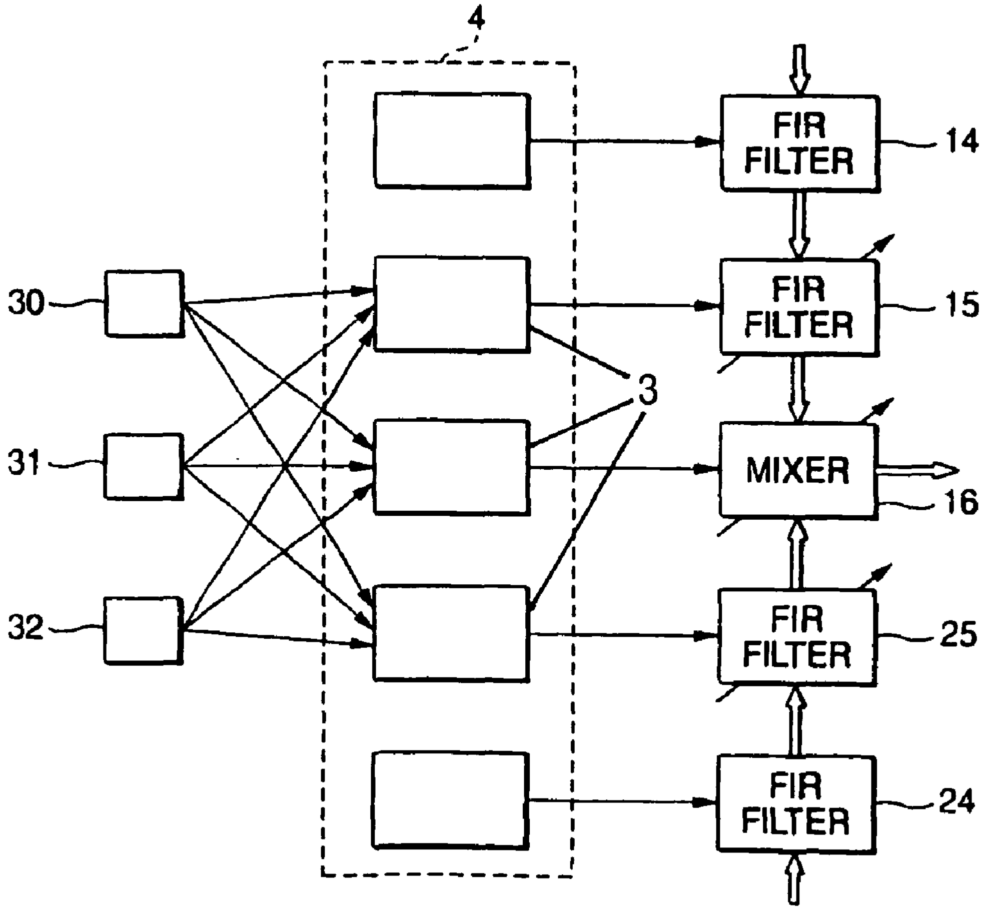
FIG. 3 is a view explaining a control system of the engine sound processing system.

That is, a control system of the engine sound processing system is illustrated as shown in FIG. 3. The control characteristics of the filter 14, the filter 24, the filter 15, the filter 25 and the mixer 16 are set by the setting on the operating portion 4. Out of them, the filters 15 and the filer 25 and the mixer 16 are formed of the active filter respectively and their characteristics are controlled in real time in response to the outputs of the sensors 30, 31, 32.

In setting the filter characteristics and the mixing rate by the operating portion 4, one or plural parameters may be set in respective filters by the manual operation, or one or plural parameter sets are stored previously in the control portion 3 and then any of the parameter sets may be selected and set. In case a plurality of parameter sets are prepared, a parameter set to give the engine sound effect like a sports vehicle, a parameter set to give the engine sound effect like a cruising of a high-class motorcar, etc. are prepared previously and then the mode may be switched to a sports vehicle mode, a cruising mode, etc. In this case, of course it is possible that the engine sound effect should not be produced by turning OFF the function of the engine sound processing system.

The system may be provided with a connector for a flash memory and/or ROM pack, and a parameter set may be supplied from the flash memory and/or ROM pack. The parameter set may be supplied through a hard disc of a vehicle navigation system. The parameter set may be downloaded through an Internet. The system may be provided with a connector such as a LAN connector and structured so that the parameter set is supplied or an user can manually set the parameter through a computer (notebook-sized personal computer) connected to the system via the connector.

Figure 6:
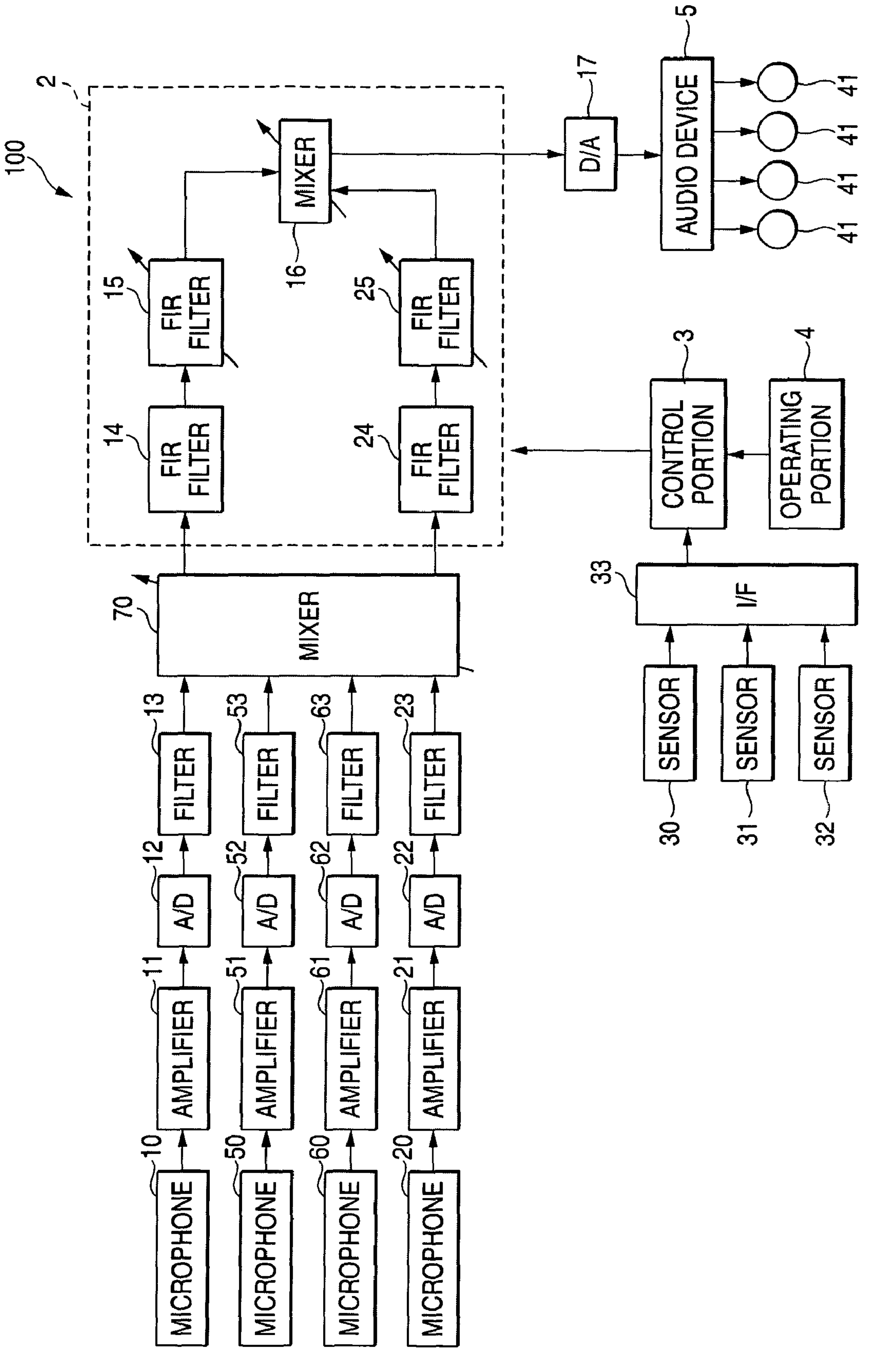
FIG. 6 is a block diagram of the engine sound processing system provided with a plurality of microphones.

The arranged position of the microphones and the number of the microphones are not limited to the above embodiment. FIG. 6 shows a block diagram showing an engine sound processing system that is an example in which a plurality of microphones (for example, 4) are further provided. Since this example includes elements which are common to the above engine sound processing system, its description is omitted and the same reference numbers are assigned to the common elements. The engine sound processing system 100 are provided with a microphone 50 and a microphone 60. The microphone 50 is arranged at the exhaust portion (vicinity of the muffler) of the engine and the microphone 60 is arranged is arranged at the engine head. The microphone 50 arranged at the exhaust port collect an engine exhaust sound. The microphone 60 arranged at the engine head collects the mechanical sound of the engine head. The microphone 50 and the microphone 60 are connected to the amplifier 51 and the amplifier 61, respectively. The amplifier 51 and the amplifier 61 amplify the sound signals (exhaust sound and mechanical sound) inputted from the microphone 51 and the microphone 61. The amplified sound signals are converted into the digital signals by an A/D converter 52 and an A/D converter 63, respectively. A filter 53 and a filter 63 cut an unnecessary frequency band of the sound signal converted into the digital signals.

The signals, frequency band and signal level of which are restricted by the filter 53 and the filter 63 are input to a mixer 70. The signals (intake sound and engine explosion sound), frequency band and signal level of which are restricted by the filter 13 and the filter 23 is output to an mixer 70 in the same manner. The mixer 70 outputs mixes the four signals and outputs to the signal processing portion 2 in two systems. The mixing ratio is controlled by the control portion 3. The signal processing portion 2 performs filtering process. The four signals may be output to the filter 14 and the filter 24 with a predetermined mixing ratio, and alternatively may be set by the user manually. For example, only a sound signal of the exhaust signal is input to the filter 14 and the other sound signals are input to the filter 24. The filter 14 and the filter 15 performs the filtering process only on the sound signal of the exhaust sound, and the filter 24 and the filter 25 performs the filtering process on the other signals. Therefore, the exhaust sound can be more emphasized than other sounds. As described above, the user can select the sound that the user wants to emphasize by changing mixing ration according to the user's preference.

Incidentally, the system may be structured so that filters are in response to a number of installed microphones and the filtering process is performed by each sound system.

Figure 4:
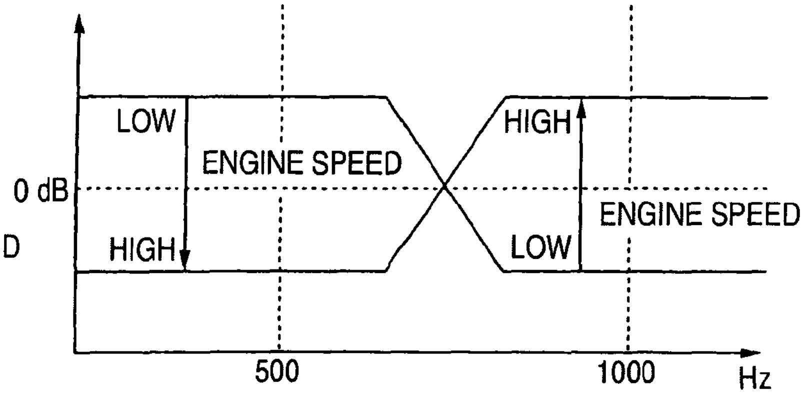
FIGS. 4A to 4D are views explaining filter characteristics in the engine sound processing system.
Figure 4:
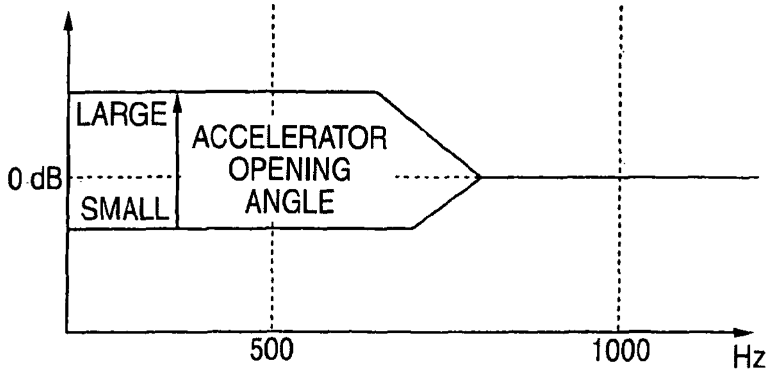
Figure 4:
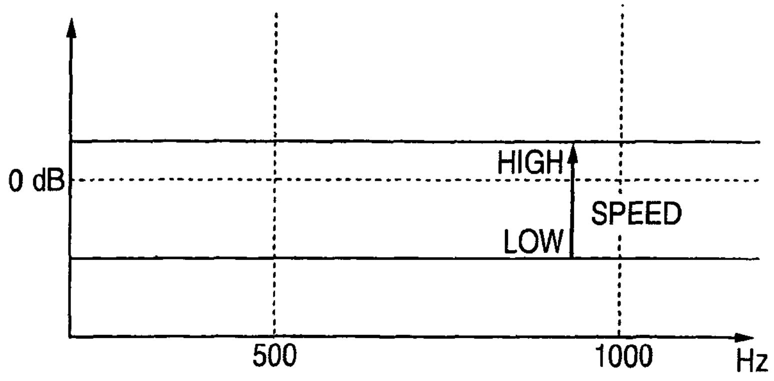
Figure 4:
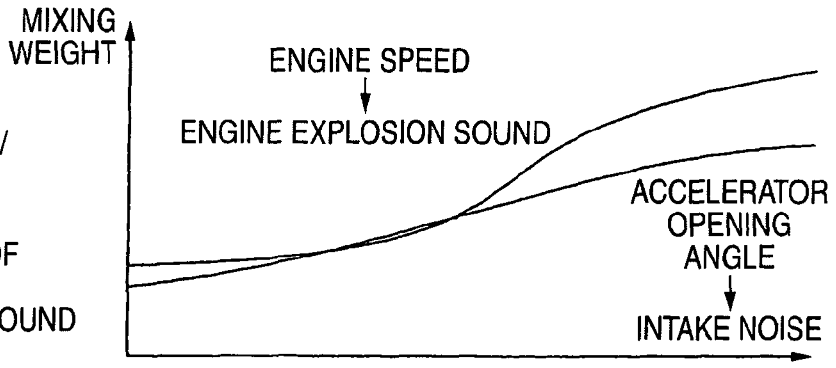

Next,an example of the characteristic control of the filter 15 and the filter 25 will be explained with reference to FIGS. 4A to 4D hereunder. The horizontal axis of the graphs shown in FIGS. 4A to 4C represents a frequency of the filter and the vertical axis represents a frequency gain of the filter. The frequency gain of the filter shown in the figures has the following characteristics.

FIG. 4A shows filter control characteristics of the intake noise and the wall surface noise based on the engine revolution, and both filter characteristics are controlled based on two rules (a) the low tone is emphasized and the high tone is suppressed when the engine revolution is low, and (b) the low tone is suppressed and the high tone is emphasized when the engine revolution is high.

FIG. 4B shows the filter control characteristic of the intake noise based on the accelerator opening angle, and the filter characteristic is controlled based on two rules (c) the low tone range of the intake noise is suppressed when the accelerator opening angle is small, and (d) the low tone range of the intake noise is emphasized when the accelerator opening angle is large.

FIG. 4C shows the control characteristic of the entire volume based on the speed, and the entire volume is controlled based on two rules (e) the entire volume is decreased when the speed is low, and (f) the entire volume is increased when the speed is high.

The horizontal axis of the graph shown in FIG. 4D represents an accelerator opening angle value and an engine revolution and the vertical axis represents a mixing weight. FIG. 4D shows a mixing weight control characteristic of the intake noise and the wall surface noise based on the accelerator opening angle and the engine revolution, and the mixing weight is controlled based on two rules (g) the mixing weight of the intake noise is increased when the accelerator opening angle is large, and (h) the mixing weight of the wall surface noise is increased when the engine revolution is high.

In this case, the mixing rate is decided by a rate of the mixing weights of the mixing weight of the intake noise and the mixing weight of the wall surface noise. The above rules are decided based on the effect that "The low tone is emphasized to produce the engine atmosphere of the large engine capacity when the engine revolution is low, while the high tone is emphasized to emphasize the high-speed revolution of the engine when the engine revolution is high. Since the load is applied to the engine when the accelerator opening angle is large, not only the intake noise is increased but also the mixing rate of the intake noise is increased. Since the noises such as the wind noise, the tire noise, etc. except the engine sound are increased when the speed is high, the entire volume are increased.", and this rule is applied to the sports car mode. The sports car mode employs the rule for emphasizing the driving conditions at the time in addition to the actual engine sound.

Another example of the characteristics control of the filter 15 and filter 26 will be described FIGS. 5A to 5D with reference to FIGS. 5A to 5D.

Figure 5:
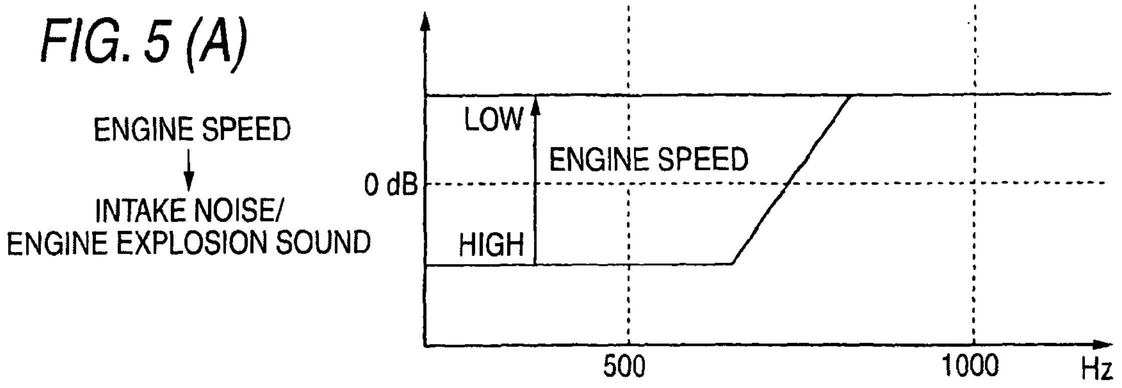
FIGS. 5A to 5D are views explaining another filter characteristics in the engine sound processing system.
Figure 5:
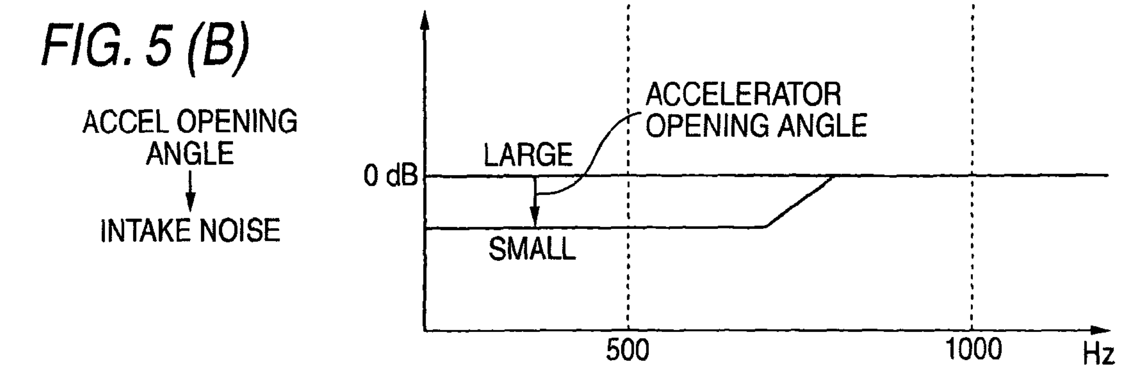
Figure 5:
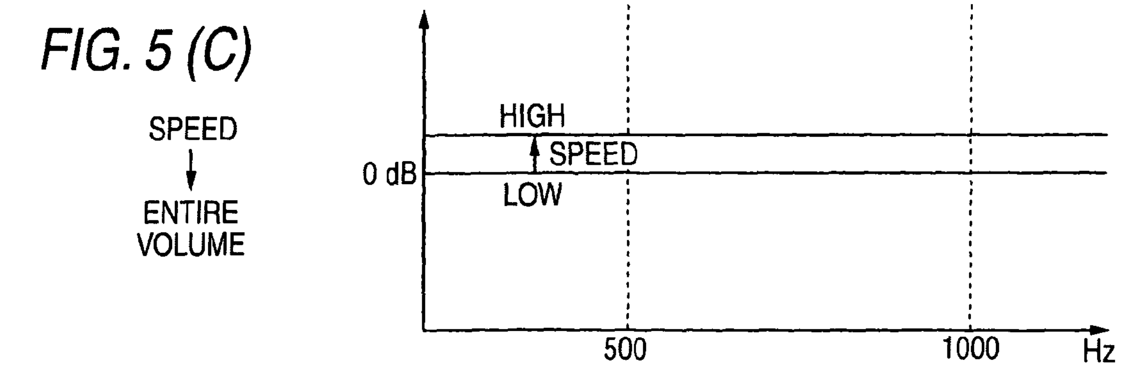
Figure 5:
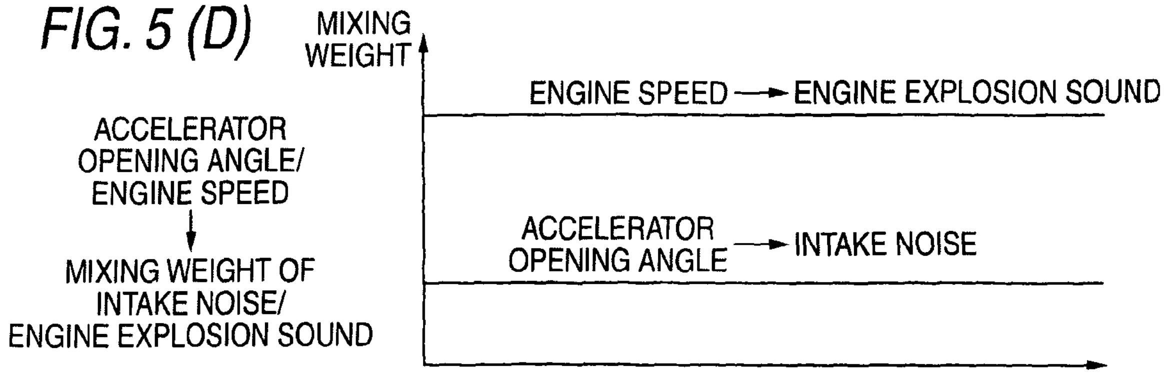

FIG. 5A shows the filter control characteristics of the intake sound and the engine explosion sound according in response to the engine revolution, and the characteristics are controlled based on the following rule:

(a) the low tone is suppressed and the high tone is emphasized when the engine revolution is low, and (b) the low tone and the high tone are emphasized when the engine revolution is high.

FIG. 5B shows the filter control characteristics of the intake sound in response to the accelerator opening angle, and the characteristic are controlled based on the following rule:

(c) the entire range of the intake noise is not emphasize and suppressed when the accelerator opening angle is small, and (d) the low tone range of the intake noise is suppressed when the accelerator opening angle is large.

FIG. 5C shows the control characteristics of the entire volume based on the vehicle speed, and the characteristics are controlled based on the following rules:

(e) the entire volume is decreased when the speed is low, and (f) the entire volume is increased when the speed is high.

FIG. 5D shows a mixing weight control characteristic of the intake noise and the wall surface noise based on the accelerator opening angle and the engine revolution, and the mixing weight is controlled based on two rules (g) the mixing weight of the intake noise is sustained when the accelerator opening angle is large, and (h) the mixing weight of the engine explosion weight is sustained irrespective of the engine revolution.

The above rule is decided based on the effect that "when the engine revolution is low, the low tone is suppressed in order to emphasize a silent characteristic, and when the engine revolution is high, the low tone is emphasize into order to emphasize that a calm atmosphere that the high-class motorcar having large displacement engine have. When the accelerator opening angle is large, although a large load is normally applied to the engine and the intake sound is large, the low tone of the intake sound is suppressed in order to emphasize the silent characteristic. When the vehicle speed is high, although the entire volume and the engine explosion sound are large since the noise such as wind sound and the tire noise except the engine noise become large, the volume is increased by a small amount in view of importance of a silent characteristics. The mixing weight of the engine explosion sound and the intake sound are not changed depending on the engine revolution and the accelerator opening angle.". This rule is applied to the cruising mode. The cruising mode employs this rule in order to provide a calm atmosphere to the user without emphasizing the engine sound as compared with the driving condition at that time.

In this case, center frequencies in the low tone range and the high tone range may be decided based on the frequency distribution of the engine sound. Normally the center frequency in the low tone range may be set to almost 500 Hz, and the center frequency in the high tone range may be set to almost 1000 Hz.

The control rules of the filter characteristics are not limited to the above rules.

In order to compose the filter characteristics on which the above rules are reflected exactly, for example, the filter characteristic curve may be derived by forming the function using respective sensor outputs as a variable and then inputting the sensor output into the function, or the filter characteristic curve may be derived by the fuzzy inference. The concerned filter characteristic may be read by formulating previously a table to decide the filter characteristic every predetermined steps of respective sensor outputs and then searching the table based on the sensor outputs. In any case, suppose that the information used to derive the filter characteristic based on the sensor outputs are contained in the above parameter sets that are set by the user.

What is claimed is:

1. An engine sound processing system comprising:

a plurality of microphones that are provided outside an interior of a vehicle and collect an engine sound of the vehicle;

a plurality of sensors that senses a driving condition of the vehicle;

a signal processing portion that includes:

a sound insulating frequency characteristic filter which simulates a sound insulating characteristic of a wall of an interior and processes the engine sound collected by the plurality of microphones based on the simulated sound insulating characteristic; and an active filter to which the engine sound processed by the sound insulating frequency characteristic filter is input and that outputs a processed signal; and a control portion that controls the active filter of the signal processing portion based on contents sensed by the plurality of sensors to vary a characteristic of the active filter according to the driving condition.

2. The engine sound processing system according to claim 1 further comprising a mixer that mixes engine sounds collected respectively by the plurality of microphones, and outputs it to the signal processing portion.

3. The engine sound processing system according to claim 1, wherein the signal processing portion separately processes the engine sounds collected by the plurality of microphones.

4. The engine sound processing system according to claim 1, wherein the plurality of sensors include at least one of a sensor for sensing an engine revolution, a sensor for sensing an accelerator opening angle, and a sensor for sensing a speed of the vehicle.

5. The engine sound processing system according to claim 1, wherein the plurality of microphones are provided at at least one of an intake port, an exhaust port and a wall of an engine room.

6. The engine sound processing system according to claim 1, wherein the microphones comprises a sound microphone or a vibration sensor.

7. The engine sound processing system according to claim 1, wherein the sound insulating characteristic filter processes the engine sound collected by the plurality of microphones independently of the driving condition of the vehicle.

8. An engine sound processing system comprising:

a plurality of microphones that are provided outside an interior of a vehicle and collect an engine sound of the vehicle;

a plurality of sensors that senses a driving condition of the vehicle;

a signal processing portion that includes:

a sound insulating frequency characteristic filter which simulates a sound insulating characteristic of a wall of an interior and processes the engine sound collected by the plurality of microphones based on the simulated sound insulating characteristic; and an active filter to which the engine sound processed by the sound insulating frequency characteristic filter is input and that outputs a processed signal; and a control portion that controls the active filter of the signal processing portion based on contents sensed by the plurality of sensors to vary a characteristic of the active filter according to the driving condition, wherein a plurality of parameter sets for varying the sound insulating frequency characteristic filter and the active filter are stored previously in the control portion, and a parameter set is selected from the parameters sets to give a specific engine sound effect.

* * * * *